United States Patent [19]

Rosen et al.

[11] Patent Number: 4,769,882
[45] Date of Patent: Sep. 13, 1988

[54] METHOD FOR MAKING PIEZOELECTRIC SENSING ELEMENTS WITH GOLD-GERMANIUM BONDING LAYERS

[75] Inventors: Carol Z. Rosen, Teaneck; Ernest C. Wittke, West Caldwell, both of N.J.

[73] Assignee: The Singer Company, Stamford, Conn.

[21] Appl. No.: 921,520

[22] Filed: Oct. 22, 1986

[51] Int. Cl.$^4$ .................................. H04R 17/00
[52] U.S. Cl. ........................... 29/25.35; 310/363; 310/364
[58] Field of Search ............... 29/25.35; 310/363, 364, 310/332; 228/263, 18, 198

[56] References Cited

U.S. PATENT DOCUMENTS

| | | | |
|---|---|---|---|
| 2,709,147 | 5/1955 | Ziegler | 29/25.35 |
| 3,281,612 | 10/1966 | Hatschek | 310/366 |
| 3,448,503 | 6/1969 | Trott et al. | 29/25.35 |
| 3,590,467 | 7/1971 | Chase et al. | 29/25.35 |
| 3,897,628 | 8/1975 | Hanak et al. | 29/25.35 |
| 3,924,312 | 12/1975 | Coussot et al. | 29/25.35 |
| 3,986,251 | 10/1976 | Altemus et al. | 228/123 |
| 4,042,951 | 8/1977 | Robinson et al. | 357/65 |
| 4,109,031 | 8/1978 | Marscher | 228/122 |
| 4,295,373 | 10/1981 | Moffatt | 73/516 R |

Primary Examiner—P. W. Echols
Attorney, Agent, or Firm—David L. Davis

[57] ABSTRACT

A piezoelectric sensing element is formed from bonding two piezoelectric layers with an intermediate metallic film. The intermediate metallic film is comprised of two separate films, which were sputtered onto the inner surfaces of the respective piezoelectric layers, which are then placed in contact with each other. The combination of piezoelectric layers and film is next heated at an elevated temperature for fusing the respective sputtered alloy films so that the piezoelectric layers are bonded into a piezo-pair sensor. The layers to be joined are chamfered so that the center electrode appears as a notch on the finished piezo-pair to allow a connection to the center electrode for poling and sensing.

12 Claims, 4 Drawing Sheets

METHOD FOR MAKING PIEZOELECTRIC SENSING ELEMENTS WITH GOLD-GERMANIUM BONDING LAYERS

FIELD OF THE INVENTION

The present invention relates to devices for sensing elastic changes, and more particularly to piezoelectric elements for sensing dynamic bending moments in these sensing elements. One use for such a device is for detection and measurement of Coriolis accelerations in a multisensor rate gyro.

BRIEF DESCRIPTION OF THE PRIOR ART

Conventionally, the preferred configuration for the piezoelectric elements is in the form of a "piezo-pair" which consists of two layers of piezoelectric materials bonded together. The piezoelectric material is polarized in such a manner that, were axial stress applied thereto, a voltage would appear between the faces of the layers. To construct such a piezo-pair, an epoxy with a conducting material mixed in is used to cement the piezoelectric layers together. However, with the epoxy type bonding, differential expansion due to temperature changes would induce bias stresses in the piezoelectric material. In themselves, these bias stresses are not harmful since they appear only as a temperature induced scale factor change that could be compensated. But, with any form of glue bonding, the temperature induced stresses would relax with time, thereby producing a scale factor/temperature change hysteresis which is prohibitively large.

Prior art directed to the joining of two piezoelectric layers includes U.S. Pat. No. 3,448,503 to Trott et al. In Trott et al., two piezoelectric layers are joined together by dissolving the silver-electroded surfaces in a heated liquid (5% silver-mercury) amalgam and by pressing the layers together at 10 PSI in an oven kept at 90° C. for 72 hours. The Trott et al. method depends on solid state diffusion and migration of mercury into the silver electrodes. Another method for joining two piezoelectric layers was disclosed by Noren in U.S. Pat. Nos. 3,481,014 and 3,573,511. In both of the patents, Noren describes a piezo-pair bond formation which is extremely complicated. The Noren piezo-pair bond is formed when the waffle shaped gold foil forms a flexible gold film bonded to the copper interfaces. The Noren process requires 650° C., 30 minutes and 80 PSI applied per face. Since vacuum conditions do not exist during the bond formation, the Noren bond could be weak, and trapped gas could exist at the joint formed by the gold foil.

BRIEF DESCRIPTION OF THE PRESENT INVENTION

The present invention successfully eliminates the aforesaid problems by providing a piezo-pair element which is not affected by bias stresses and which is simple to manufacture. For the present invention piezo-pair element, a metallic material such as gold-germanium (Au-Ge) is first sputtered onto the opposed surfaces of the piezoelectric layers which are to be bonded. The layers are heated sufficiently to fuse the Au-Ge material so that the piezoelectric layers are bonded to form a piezo-pair. Upon cooling, the piezo-pair is poled. To facilitate the making of an electrical contact to the center conducting portion of the completed piezo-pair, the edges of the ceramic layers are chamfered prior to the sputtering operation. This results in a piezo-pair having a V shaped electrode contact at the center metallic layer.

It is therefore an object of the present invention to provide a sensing piezoelectric element which is impervious to any bias stresses caused by changes in temperature.

It is a further object of the present invention to provide a simple method for fabricating piezo-pair elements for detecting changes in stress in a multisensor.

The above-mentioned objects and advantages of the present invention will become more apparent and the invention itself will be best understood by reference to the following description of an embodiment of the invention taken in conjunction with the accompanying drawings, wherein:

BRIEF DESCRIPTION OF THE FIGURES

FIG. 3b shows the matching of the FIG. 3a piezoelectric layers to obtain an embodiment more detailedly shown in FIG. 4a;

FIG. 4b is a perspective view of the piezo-pair shown in FIG. 4a;

DETAILED DESCRIPTION OF THE PRESENT INVENTION

Figure 1:
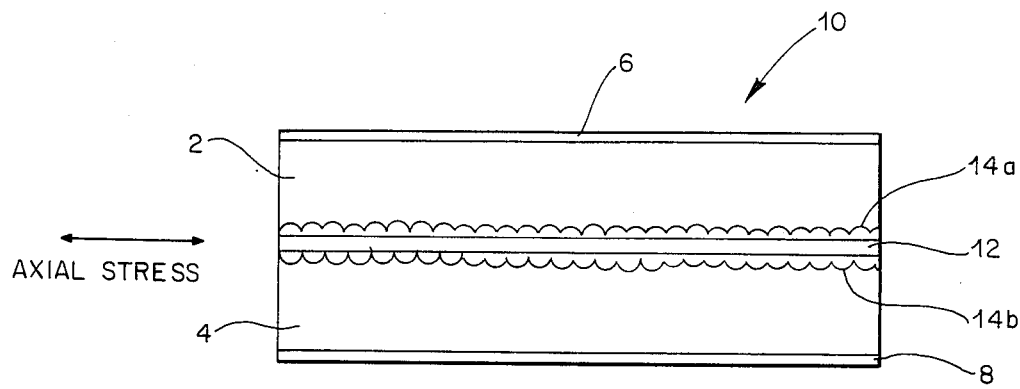
FIG. 1 depicts a prior art piezo-pair.

Referring now to FIG. 1, there is shown a conventional piezo-pair sensor having two layers of piezoelectric material 2 and 4 of approximately 0.024 inches thick. Coated on the outer surfaces of respective layers 2 and 4 are corresponding electrodes 6 and 8. These electrodes, which may be made up of silver, nickel, or gold for example cover all or part of the length of piezo-pair sensor 10. Piezoelectric layers 2 and 4 are bound to a center foil thereof by means of epoxy layers 14a and 14b. Center foil 12 is approximately 0.003 millimeters thick and can be made from a number of materials such as brass or tantalum, to name a few. As is well known, the materials which make up center foil 12 and piezoelectric layers 2 and 4 have different coefficients of expansion, and therefore do not expand at the same rate. Hence, when there is a temperature change, axial stresses between center foil 12 and piezoelectric layers 2 and 4 show up as shears in epoxy cement layers 14a and 14b, respectively. A presence of the axial stresses modifies the sensitivity of the piezo-pair sensor as a signal generator. Furthermore, because the epoxy layers do flow with time, so as to relieve the stresses locked therein, "creep" results in the piezo-pair sensor. Thus, were an instrument made of such a conventional piezo-pair sensor used over a varied temperature range, a hysteresis movement in its temperature sensitivity curve would be obtained. Putting it another way, when the temperature varies, instead of getting a discrete sensitivity for a given temperature, a conventional piezo-pair sensor instrument obtains measurements which varies with time for a given temperature.

To overcome the "creep" phenomenon, a method of joining two layers with a material that is not subject to flow must be used. Such a material must have the following criteria:

It must be electrically conductive;
It must adhere to the piezoelectric material;
It will not creep under stress;
It must have sufficient tensile strength; and
It can be applied to each piezoelectric layer and then bonded to itself without any additional agent.

In addition, the method of bonding the two piezoelectric layers with this material must take into consideration the fact that the bonding temperature must be greater than the operating and poling temperature of a piezo-pair sensor thus formed, and less than the firing temperature for creating the piezoelectric layers. The Au-Ge alloy which has 12 weight percent germanium, [Au-12 w/o Ge] could be used for bonding the two piezoelectric layers to form a piezo-pair sensor.

Figure 2:
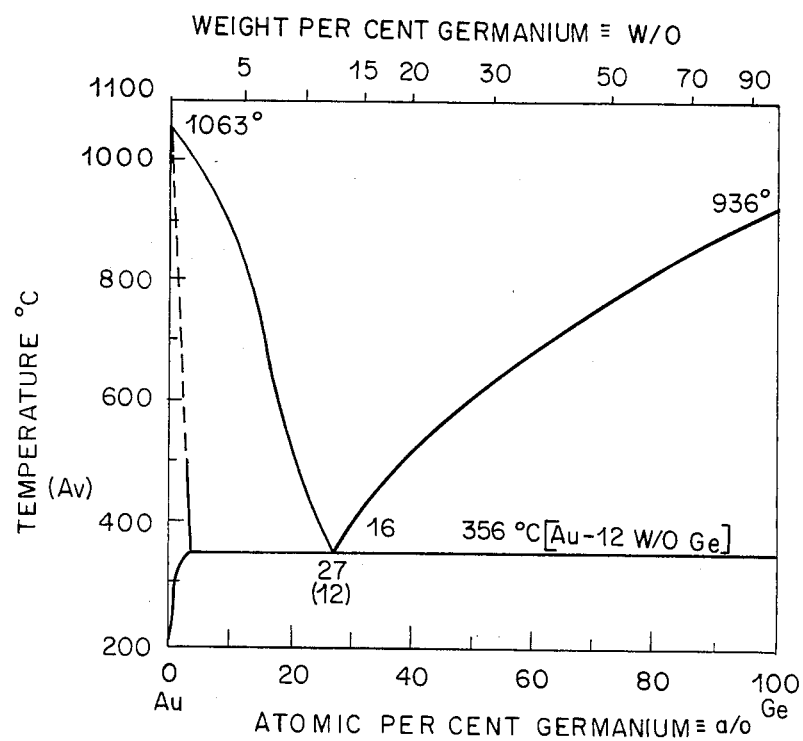
FIG. 2 is a graph showing the temperature range of an Au-Ge alloy.

Referring now to FIG. 2, it can be seen that this Au-Ge alloy has a eutectic temperature 16 which is 356° C. Such a eutectic temperature is low enough so that it does not approach the temperature whereby the characteristics of the piezoelectric layers would be changed and yet high enough so that it is sufficiently above the operating temperature of a sensor made from piezoelectric elements bonded by such an alloy, and sufficiently above the poling temperature of the piezoelectric element.

Figure 3A:
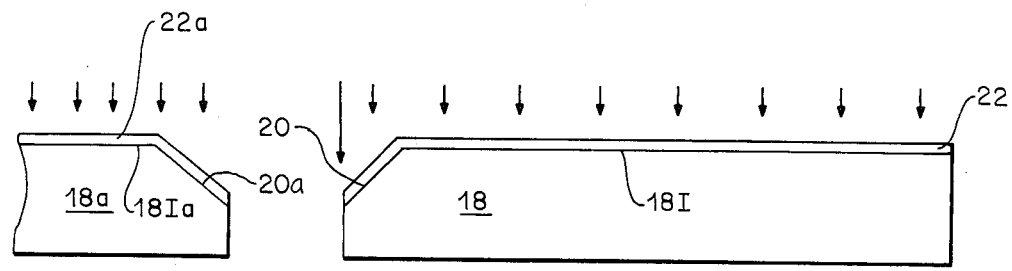
FIG. 3a shows the sputtering of metallic film onto matching piezoelectric layers.

Referring now to FIG. 3a, there is shown a piezoelectric layer 18. [Au-Ge] film 22 is sputtered by the aforesaid Au-Ge alloy target of the same stoichiometry. For the ease of connecting an electrical contact to inner surface 18I, an edge of the same is chamfered at point 20. The reason sputtering is used to deposit the Au-Ge alloy onto inner surface 18I is that the depth of the deposition and the stoichiometry of the alloy can be precisely controlled. Needless to say, the thickness of Au-Ge film 22 is drawn for illustration purposes only and it may in fact have a thickness of less than 25,000 Angstroms.

Figure 3B:
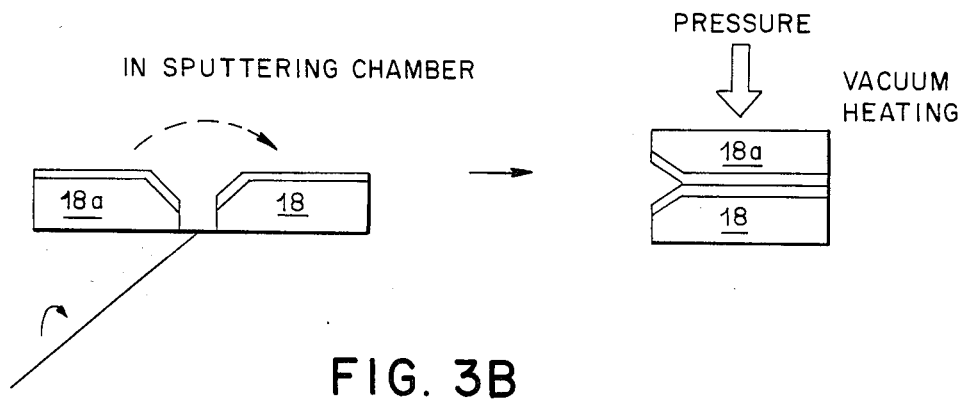

After piezoelectric layer 18 has been sputtered with Au-Ge film 22, it is combined with a corresponding piezoelectric layer 18a, which also has sputtered thereon at its inner surface 18Ia a film 22a of Au-Ge alloy. In FIG. 3b element 18a is shown rotated over and in proximity with element 18; and pressure is applied to cause bonding when temperature is raised above the eutectic temperature of the [Au-12 w/o Ge] for a short time with maintained vacuum conditions. The fused part then provides an internally chamfered edge which is electrically conducting and integral with the conducting layer which now forms the center electrode of the resultant peizo-pair. The chamfered notch is useful for the attachment of the wire lead. See also FIG. 4a.

Of course, film 22 also has an outer surface 22I chamfered at position 24. For this embodiment, film 22a of the second wafer is placed on top of the corresponding surface 22I with chamfered edges 24 and 24a in alignment. A combination of layers 18 and 18a and films 22 and 22a, hereinafter designated as piezo-pair 26, is then heated at an elevated temperature so that the respective Au-Ge films on corresponding outer surfaces 22I and 22Ia can fuse, thereby bonding piezoelectric layer 18 intimately to the corresponding piezoelectric layer 18a. See FIG. 3b.

For this embodiment, since [Au-12 w/o Ge] is used, the temperature which is needed to cause the two Au-Ge alloy films to fuse is the eutectic temperature of the same. It should be appreciated that were a different composition or a chemically different alloy which contains all the criteria mentioned hereinabove used, the eutectic temperature, i.e., the temperature which is needed to fuse the alloy films for bonding the two piezoelectric layers, would of course be different.

After piezo-pair 26 has been heated at the Au-Ge alloy eutectic temperature for a specific length of time, it becomes "creep-free", as films 22 and 22a are bonded together to form a one piece piezo-pair. Hence, regardless of how much stress is applied thereto, there will not be any "creep" between film 22, 22a and the piezoelectric layers, 18 and 18a. Too, it should be appreciated that since the dimension of alloy film 22, 22a is extremely thin, stress experienced by layers 18 and 18a and film 22, 22a is minimal.

Figure 4A:
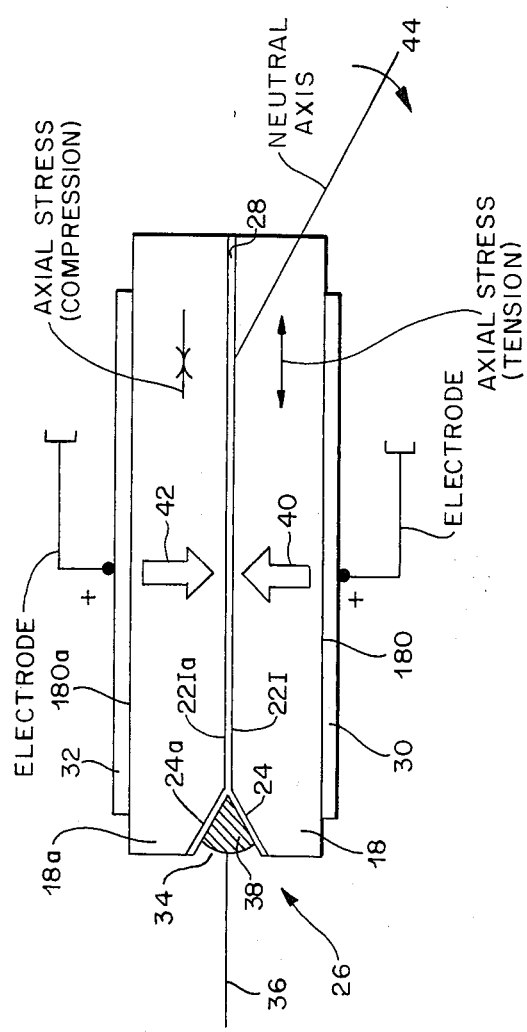
FIG. 4a shows an embodiment of the present invention piezo-pair.

A present invention method further includes the depositing of metallic conductor layers 30 and 32 on respective outer surfaces 18o and 18oa of corresponding layers 18 and 18a. To expedite the bonding of layer 18 to 18a, as was discussed previously in relation to FIG. 3b, a small pressure such as 5 PSI may be applied. As can be seen in FIG. 4a, a 'V' notch 34 is formed from the aligned chamfered edges 24 and 24a. Note that notch 34 is necessitated by the fact that in a real world setting, because the dimension of alloy film 28 is extremely thin, a place must be provided somewhere on piezo-pair 26 for the attachment of an electrode to alloy film 28. As shown, an electrode 36 is connected to alloy film 28 by means of solder 38. It is via electrode 36 that signals corresponding to stress applied to piezo-pair 26 are obtained. The poling and sensing of the piezo-pair element is discussed hereinbelow.

Most piezoelectric materials require that the sensor constructed therefrom be poled in order to be activated. Such poling is conventionally accomplished by heating the material to a temperature which is both high enough to permit poling and sufficiently above the device operating temperature to prevent depoling during operation. A high voltage is applied between the electrodes while at the elevated temperature to cause the dipole moments of the piezoelectric material to align parallel to the arrows 40 and 42 of FIG. 4a. With the poling polarity shown in FIG. 4a, if a bending moment is applied to the piezo-pair 26 about axis 44, one layer (18 for example) would be in tension and the other layer (18a for example) would be in compression. In the piezo-pair configuration, the sensor measures bending moments applied to the beam about axis 44. These bending moments apply a tension in one layer and a compression in the other layer. Depending whether the device is to be electrically connected with the layers in series or in parallel, the layers are poled with polarization vectors 40 and 42 aligned antiparallel or parallel to each other. Polarization of the layers in the antiparallel direction requires that a voltage be applied between the center electrode and between the outer electrodes connected in parallel. Polarization of the layers in the parallel direction requires that a voltage be applied only between the outer electrodes. Sensing the output of the antiparallel polarized piezo-pair requires that the signal be measured between the outer electrodes. Sensing of the output of the parallel polarized piezo-pair requires that the signal be measured between the center electrode and between the outer electrodes connected in parallel. In either polarization case, it is necessary that an electrical connection to the center electrode be readily achieved. This electrical connection is facilitated by the "V" notch which results when the chamfered surface of these two wafers are combined into the piezo-pair of FIG. 4b since the center electrode is continuous along the surface of the "V".

Since piezo-pair 26 in effect is a unitary sensor, it is substantially impervious to "creep", thereby the measurements which the detector obtains from alloy film 28 are much more accurate and are devoid of distortions.

Figure 4B:
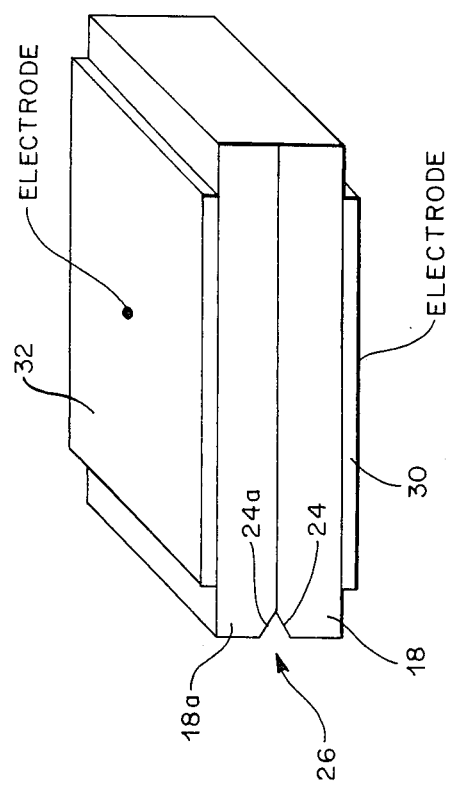

FIG. 4b shows a perspective view of the piezo-pair sensor shown in FIG. 4a.

Another embodiment of this invention allows a piezoelectric layer to be bonded to materials other than another piezoelectric. In some applications, it is desirable to bond the piezoelectric material to a layer of non-piezoelectric material such as metal or glass to produce an equivalent bi-layered structure. Such layering may be repeated to provide as many layers as required.

Figure 5:
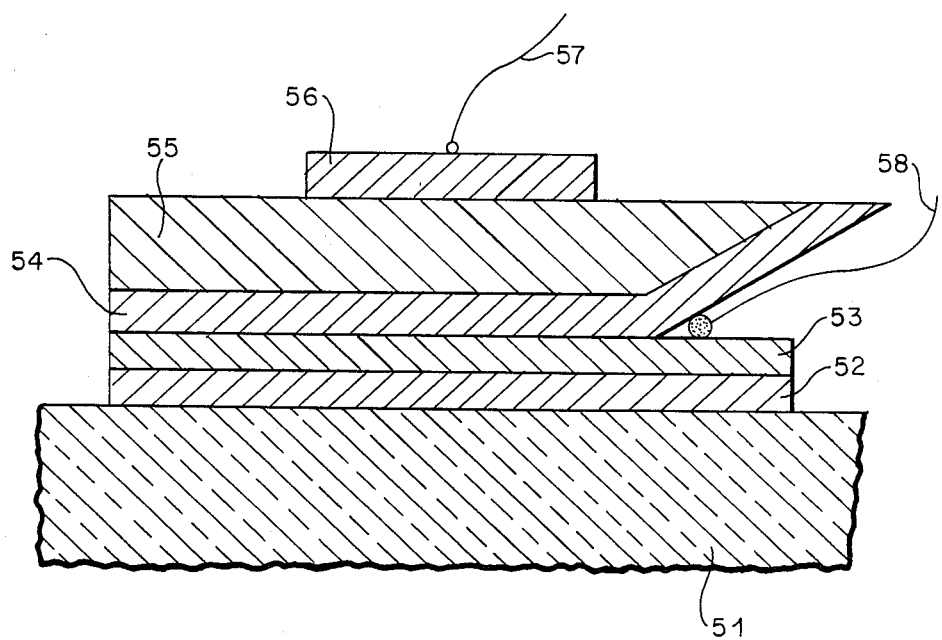
FIG. 5 shows a cross-sectional view of a second embodiment of the present invention.

For example, as shown in FIG. 5, a non-piezoelectric material layer 51 is bonded to a piezoelectric material layer 55. The bonding of piezoelectric material 55 to non-piezoelectric layer 51 requires that the non-piezoelectric layer be compatible (in terms of bonding) with gold/germanium layer 54. In the event that gold/germanium layer 54 is not compatible with non-piezoelectric layer 51, a suitable interface layer such as 52 needs to be deposited on non-piezoelectric layer 51. A gold/germanium layer 53 is then sputtered onto interface layer 52, and piezoelectric material layer 55 is joined to non-piezoelectric material layer 51 in a manner similar to that described hereinabove for the piezo-pair configuration.

It is via electrodes 57 and 58 that signals corresponding to stress applied to piezoelectric layer 55 are obtained.

Figure 6:
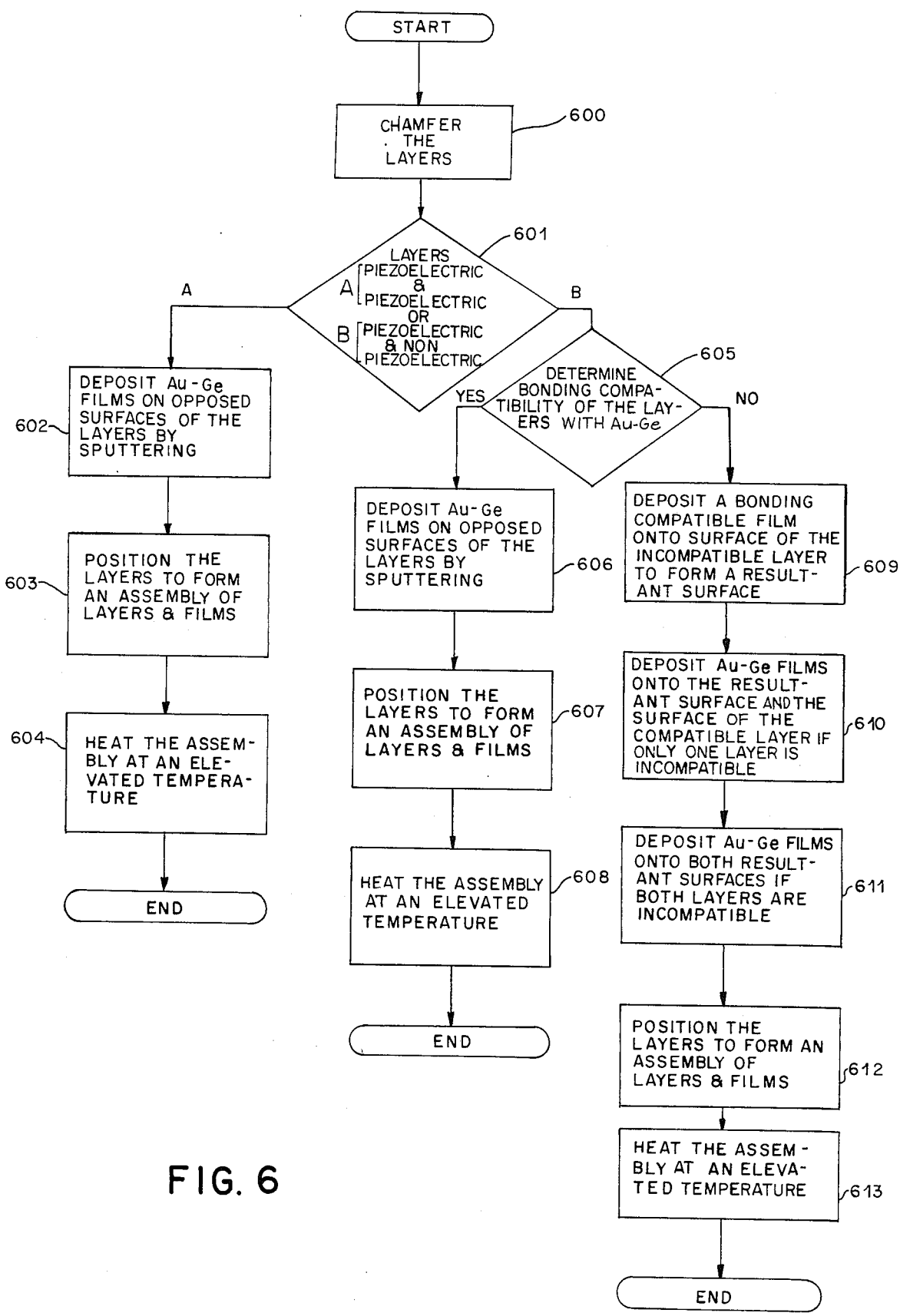
FIG. 6 is a flow diagram illustrating the methods for forming the embodiments shown in FIGS. 4 and 5.

FIG. 6 illustrates the steps for forming the different embodiments of the instant invention. Starting with block 600, it can be seen that the layers are chamfered for each of the embodiments. After chamfering, a determination is made as to whether the layers are both piezoelectric or are piezoelectric and non-piezoelectric, per block 601. If the layers are in fact both piezoelectric layers, then via route A, gold-germanium films are deposited on the opposed surfaces of the layers by sputtering, per block 602. Next, as shown in block 603, the layers are positioned so as to form an assembly of layers and films. And the assembly is heated at an elevated temperature, per block 604.

On the other hand, if the layers, as determined in block 601, are found to be comprised of a piezoelectric and non-piezoelectric layer, then a next determination via route B, per block 605, as to whether these layers are compatible with gold-germanium is taken. If they are compatible, then gold-germanium films are deposited onto opposed surfaces of the layers by sputtering, per block 606. Next, these layers are positioned to form an assembly of layers and films, per block 607. After which, the assembly is heated at an elevated temperature, per block 608.

However, if there is no bonding compatibility between the layer(s) and gold-germanium, then a bonding compatible film has to be deposited onto the surface of the incompatible layer so as to form a resultant surface, per block 609. Following that, gold-germanium films are deposited onto the resultant surface and the surface of the compatible layer, respectively, if only one of the layers is incompatible with gold-germanium, as shown in block 610. If both layers are incompatible with gold-germanium, the gold-germanium films are deposited onto the respective resultant surfaces, per block 611. Thereafter, like the previous embodiments, the layers are positioned to form an assembly of layers and films; and the assembly is then heated at an elevated temperature, per block 612 and 613, respectively.

While a preferred embodiment of the invention is disclosed herein, for purposes of explanation, numerous changes, modifications, variations, substitutions and equivalents, in whole or in part, will now be apparent to those skilled in the art to which the invention pertains. Accordingly, it is intended that the invention be limited only by the spirit and scope of the appended claims.

We claim:

1. A method of forming a piezo-pair sensing element comprising:
    chamfering a first edge at opposed surfaces of respective first and second piezoelectric layers;
    depositing a gold-germanium film on the respective opposed surfaces of the piezoelectric layers, the gold-germanium films acting as an interface for the layers;
    positioning the piezoelectric layers in parallel to each other, the opposed surfaces being in contact at their gold-germanium interface and the chamfered edges being in alignment for forming an assembly of the layers and films;
    heating the assembly at an elevated temperature for metallurgically bonding the respective gold-germanium films of the first and second piezoelectric layers intimately to form the piezo-pair sensing element, a chamfered notch being formed from the chamfered edges, wherein the piezo-pair sensing element is substantially impervious to creep.

2. A method according to claim 1, wherein the depositing step comprises the sputtering of the gold-germanium films on the opposed surfaces of the piezoelectric layers.

3. A method according to claim 1, wherein the heating step comprises the heating of the assembly to the melting temperature of the interface gold-germanium films.

4. A method according to claim 1, further comprising:
    depositing respective metallic films on unopposed surfaces of the piezoelectric layers for effecting electrical contacts for the piezo-pair sensing element.

5. A method according to claim 1, further comprising the step of applying a pressure to the assembly during the heating step for expediting the bonding of the layers.

6. A method of forming an element for sensing bending moment, comprising:
    chamfering a first edge at opposed surfaces of respective piezoelectric and non-piezoelectric layers;
    determining bonding compatibility between the piezoelectric layer and gold-germanium and between the non-piezoelectric layer and gold-germanium;
    wherein, if the piezoelectric and non-piezoelectric layers are compatible, depositing respective gold-germanium films onto the opposed surfaces of the piezoelectric layer and the non-piezoelectric layer, the gold-germanium films acting as an interface;

positioning the piezoelectric and non-piezoelectric layers in parallel, the opposed surfaces thereof being in contact at the gold-germanium interface and the chamfered edges being in alignment for forming an assembly of the layers and films;

heating the assembly at an elevated temperature for metallurgically bonding the piezoelectric layers intimately, thereby forming a sensing element substantially impervious to creep.

7. A method according to claim 6, wherein the depositing step comprises the sputtering of the gold-germanium films.

8. A method according to claim 6, wherein the heating step comprises the heating of the assembly to the melting temperature of the gold-germanium films.

9. A method according to claim 6, further comprising the step of applying a pressure to the assembly during the heating step for expediting the bonding of the layers.

10. A method of forming an element for sensing bending moment, comprising the steps of:

chamfering a first edge at opposed surfaces of respective piezoelectric and non-piezoelectric layers;

determining bonding compatibility between the piezoelectric layer and gold-germanium and between the non-piezoelectric layer and gold-germanium;

wherein, if either one or both of the piezoelectric and non-piezoelectric layers are not compatible with gold-germanium, depositing a bonding compatible film onto the surface of the incompatible layer to form a resultant surface;

depositing a first film of gold-germanium onto the resultant surface of whichever layer has deposited thereto the bonding compatible film and a second film of gold-germanium onto the surface of the gold-germanium compatible layer if only one of the piezoelectric and non-piezoelectric layers is not compatible with gold-germanium;

depositing a first film of gold-germanium onto the resultant surface of the piezoelectric layer and a second film of gold-germanium onto the resultant surface of the non-piezoelectric layer if both of the piezoelectric and non-piezoelectric layers are not compatible with gold-germanium;

positioning the piezoelectric and non-piezoelectric layers in parallel for forming an assembly having the layers and films, the first and second gold-germanium films being in contact and the chamfered edges being in alignment;

heating the assembly at an elevated temperature for metallurgically bonding the first and second gold-germanium films and thereby the layers intimately to form a substantially creep-free sensing element.

11. A method according to claim 10, wherein the heating step comprises the heating of the assembly to the melting temperature of the gold-germanium films.

12. A method according to claim 10, further comprising the step of applying a pressure to the assembly during the heating step for expediting the bonding of the layers.

* * * * *